(12) United States Patent
Cook et al.

(10) Patent No.: US 9,780,017 B2
(45) Date of Patent: Oct. 3, 2017

(54) PACKAGED DEVICE WITH ADDITIVE SUBSTRATE SURFACE MODIFICATION (71) Applicant: TEXAS INSTRUMENTS INCORPORATED, Dallas, TX (US)

(72) Inventors: Benjamin Stassen Cook, Addison, TX (US); Juan Alejandro Herbsommer, Allen, TX (US); Yong Lin, Plano, TX (US); Rongwei Zhang, Plano, TX (US); Abram Castro, Carrollton, TX (US); Matthew David Romig, Wylie, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/346,822

(22) Filed: Nov. 9, 2016

(65) Prior Publication Data
US 2017/0053854 A1 Feb. 23, 2017

Related U.S. Application Data (63) Continuation of application No. 14/848,975, filed on Sep. 9, 2015, now Pat. No. 9,524,926.
(Continued)

(51) Int. Cl.
*H01L 23/49* (2006.01)
*H01L 23/495* (2006.01)
(Continued)

(52) U.S. Cl.
CPC ...... *H01L 23/4952* (2013.01); *H01L 21/2885* (2013.01); *H01L 21/4821* (2013.01); *H01L 21/4825* (2013.01); *H01L 21/4867* (2013.01); *H01L 23/49513* (2013.01); *H01L 23/49541* (2013.01); *H01L 23/49572* (2013.01);
(Continued)

(58) Field of Classification Search
CPC . H01L 2224/73265; H01L 2224/32245; H01L 2224/48247; H01L 2924/00; H01L 2224/32225; H01L 2224/48227
See application file for complete search history.

(56) References Cited

U.S. PATENT DOCUMENTS 7,078,809 B2   7/2006 Yap et al.
7,824,963 B2   11/2010 Walberg et al.
(Continued)

OTHER PUBLICATIONS

International Search Report from corresponding PCT Application No. PCT/US2015/052706, dated Dec. 29, 2015 (2 pages).

*Primary Examiner* — Roy Potter
*Assistant Examiner* — Paul Patton
(74) *Attorney, Agent, or Firm* — John R. Pessetto; Charles A. Brill; Frank D. Cimino (57) ABSTRACT A method of lead frame surface modification includes providing at least one pre-fabricated metal lead frame or package substrate (substrate) unit including a base metal having a die pad and a plurality of contact regions surrounding the die pad. An ink including a material that is a solid or a precursor for a solid that forms a solid upon a curing step or a sintering step that removes a liquid carrier is additively deposited including onto at least one of (i) a region of the die pad and (ii) at one region of at least a first of the contact regions (first contact region). The ink is sintered or cured to remove the liquid carrier so that a substantially solid ink residue remains.

20 Claims, 6 Drawing Sheets

Related U.S. Application Data (60) Provisional application No. 62/055,990, filed on Sep. 26, 2014.

(51) Int. Cl.

| | | |
|---|---|---|
| *H01L 21/288* | (2006.01) | |
| *H01L 21/48* | (2006.01) | |
| *H01L 23/498* | (2006.01) | |
| *H01L 23/00* | (2006.01) | |
| *H01L 25/065* | (2006.01) | |
| *H01L 25/00* | (2006.01) | |

(52) U.S. Cl.
CPC .. *H01L 23/49582* (2013.01); *H01L 23/49586* (2013.01); *H01L 23/49822* (2013.01); *H01L 23/49838* (2013.01); *H01L 23/49883* (2013.01); *H01L 24/05* (2013.01); *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *H01L 25/0657* (2013.01); *H01L 25/50* (2013.01); *H01L 2224/04042* (2013.01); *H01L 2224/0612* (2013.01); *H01L 2224/32225* (2013.01); *H01L 2224/32245* (2013.01); *H01L 2224/48227* (2013.01); *H01L 2224/48247* (2013.01); *H01L 2224/73265* (2013.01); *H01L 2224/92247* (2013.01); *H01L 2225/0651* (2013.01); *H01L 2225/06555* (2013.01); *H01L 2924/00014* (2013.01); *H01L 2924/13055* (2013.01); *H01L 2924/14* (2013.01); *H01L 2924/1511* (2013.01); *H01L 2924/1711* (2013.01); *H01L 2924/181* (2013.01)

(56) References Cited

U.S. PATENT DOCUMENTS

| | | | |
|---|---|---|---|
| 2003/0122224 A1* | 7/2003 | Shih | H01L 23/49582 257/676 |
| 2003/0143777 A1 | 7/2003 | Camenforte et al. | |
| 2013/0122654 A1* | 5/2013 | Ho | H01L 23/49503 438/118 |
| 2014/0004697 A1 | 1/2014 | Shen | |
| 2014/0175599 A1 | 6/2014 | Romig et al. | |
| 2014/0284779 A1* | 9/2014 | Hayata | H01L 24/48 257/676 |

* cited by examiner

PACKAGED DEVICE WITH ADDITIVE SUBSTRATE SURFACE MODIFICATION

CROSS REFERENCE TO RELATED APPLICATIONS

This continuation application claims priority to U.S. patent application Ser. No. 14/848,975, now U.S. Pat. No. 9,524,926, filed Sep. 9, 2015, which claims the benefit of Provisional Application Ser. No. 62/055,990, filed Sep. 26, 2014, both applications of which are herein incorporated by reference in their entirety.

FIELD

Disclosed embodiments relate to lead frame packaging of semiconductor devices and resulting packaged semiconductor devices.

BACKGROUND

A variety of semiconductor chip packages are known that provide support for an integrated circuit chip (IC) or die and associated bond wires, provide protection from the environment, and enable surface mounting of the die to and interconnection with a printed circuit board (PCB). One conventional package configuration includes a lead frame having a die pad and surrounding wire bond (or contact) pads.

Lead frame semiconductor packages are well known and widely used in the electronics industry to house, mount, and interconnect a variety of ICs. A conventional lead frame is typically die-stamped or chemically etched from a sheet of flat-stock metal, and includes a plurality of metal leads temporarily held together in a planar arrangement about a central region during package manufacture by a rectangular frame comprising a plurality of expendable "dam-bars." A mounting pad (or die pad) for a semiconductor die thereon is supported in the central region by "tie-bars" that attach to the frame. The leads extend from a first end integral with the frame to an opposite second end adjacent to, but spaced apart from, the die pad.

Known challenges to lead frame packaging of semiconductor devices include adhesion of the die attach material, mold compound, and wire bonds to the surface of the lead frame. Known methods of adhesion modification include coating the lead frame surface with an adhesion promoter layer, and global roughening of the lead frame surface using an aggressive electrolytic plating step to provide a plating layer with a large grain structure or a micro-etching step that uses a chemical solution to etch the base material to increase the interfacial area for mechanical locking.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include methods of lead frame or package substrate surface modification of a pre-fabricated metal lead frame or package substrate unit having a die pad and a plurality of contact regions (which can be also called pins or terminals) surrounding the die pad. An ink includes a material that is either solid (e.g., particles, such as nanoparticles) or a precursor for a solid that forms a solid (e.g., particles) upon curing or sintering to remove its liquid carrier including a solvent and/or dispersant. For example, the ink can be, for example, a sinterable metal ink or a UV-curable polymer or a UV-curable polymer-based mixture. The ink is additively depositable by a printer platform onto at least one of (i) a region of the die pad and (ii) a region of the plurality of contact regions. The ink deposition apparatus can be an inkjet printer that uses piezoelectric, thermal, or acoustic printing, an electrostatic inkjet printer, or a screen or flexographic printer.

The surface modification can be global, or optionally be a patterned surface modification where there are resulting surface modified regions (e.g., selective roughening, selective adhesion promotion, or selective surface energy changes) and non-surface modified regions. Selective roughening structures aid in adhesion of the die attach material, mold compound, wire bonds, or solder to the surface of the substrate.

In the case of a metal ink used to modify a lead frame, the metal material in the metal ink can be different from the base metal of the lead frame to aid in wirebond adhesion. The metal ink can be patterned into films, or patterned into a plurality of discrete islands (each island corresponding to drops of ink). By patterning the resulting printed metal into islands, a surface having a typical resulting average (root mean square (rms)) surface roughness from 1 μm to 50 μm can be achieved. The patterned metal can also be printed into a film, and rapidly dried to cause solvent eruptions (evaporation) during metal sintering. This will cause a pocketed and rough surface with a high porosity and roughness.

Another embodiment applies a patterned adhesion layer to the substrate surface by printing non-metallic materials such as a polymer (e.g., a polyimide, an epoxy-based negative photoresist known as SU-8, poly (p-phenylene-2,6-benzobisoxazole) (PBO), silane), or a non-organic dielectric layer (e.g., SiN, $SiO_2$) followed by metal plating and removal of the non-metallic materials to form metal pillars. This also aids in adhesion of a mold compound or die attach material to the lead frame surface. Another embodiment includes additively patterning a surface adhesion layer which is not rough, but has good chemical adhesion to both the lead frame surface or die attach or mold compound such as a porous Polyimide/PBO/SU-8, silanes, Hexamethyldisilazane (HMDS), SiN or $SiO_2$. Another embodiment additively applies a patterned surface energy modification to contain materials deposited onto the lead frame such as die attach material and solder flux, which typically otherwise can bleed over the lead frame and cause yield loss and reliability problems. These materials for containment are of low surface energy (hydrophobic) such as a fluorinated polyimide, SU-8, or polytetrafluoroethylene (PTFE).

Each of the above disclosed lead frame or package substrate surface modifications can be patterned with a resolution below about 1 μm using piezoelectric, thermal, acoustic, or electrostatic inkjet techniques, or related additive deposition techniques, typically 20 μm resolution with piezoelectric techniques, and 1 μm resolution with electrostatic techniques. Disclosed additive deposition processes can be applied to a single unit, but are generally applied to a batch or a plurality of units, such as to a lead frame sheet or substrate sheet (or panel) or using a roll with reel-to-reel processing.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1:
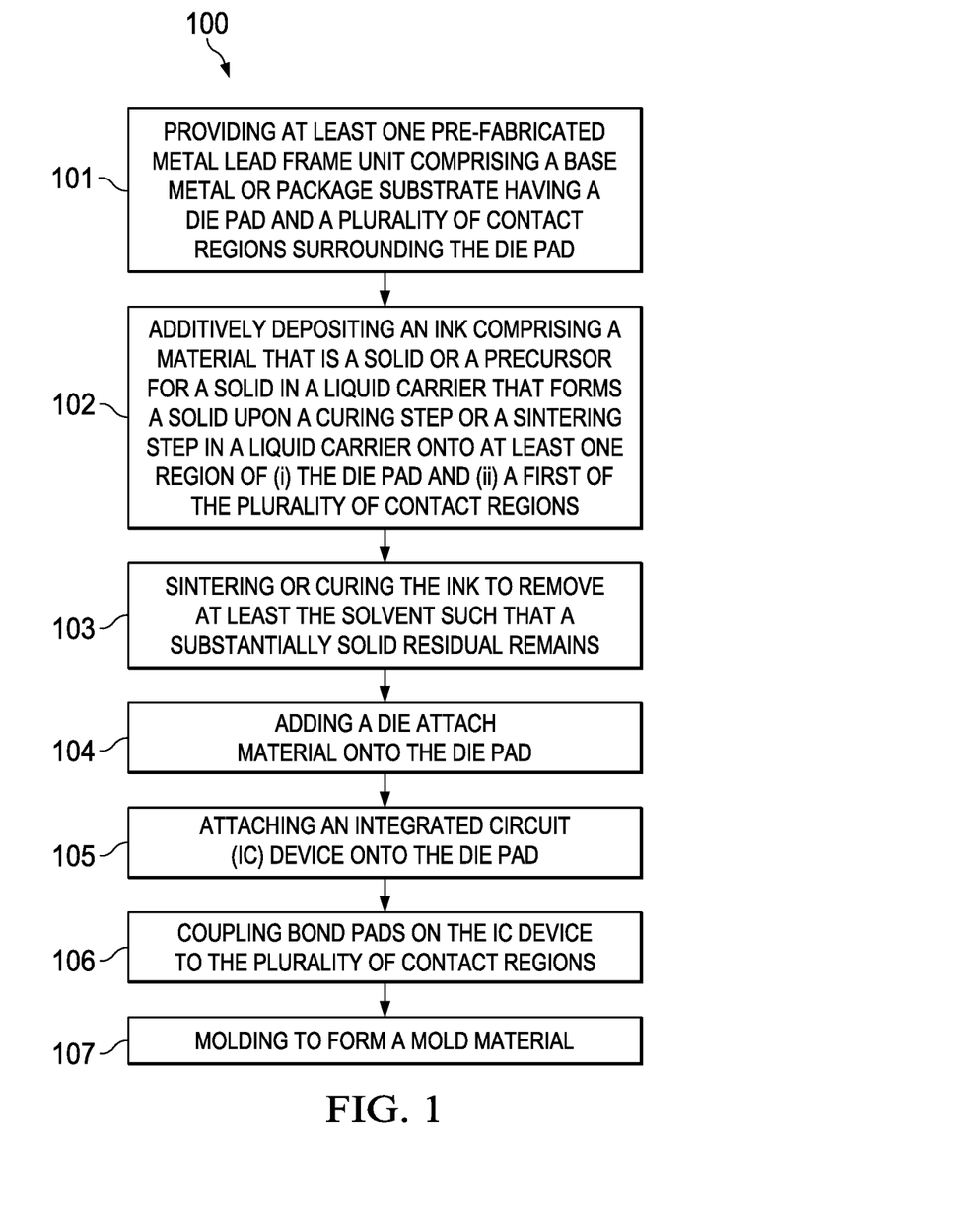
FIG. 1 is a flow chart that shows steps in an example method of additive substrate surface modification, according to an example embodiment.

Disclosed methods of additive substrate surface modification remove the need for a conventional costly plating or micro-etching using an etch solution required in known lead frame roughening processes. FIG. 1 is a flow chart that shows steps in an example method 100 of additive substrate surface modification, according to an example embodiment. Step 101 comprises providing at least one pre-fabricated metal lead frame or package substrate (a lead frame or a package substrate collectively referred to as a "substrate") unit comprising a base metal having a die pad and a plurality of contact regions surrounding the die pad. The package substrate can comprise a ceramic substrate, a ball grid array (BGA), a pin grid array (PGA), a printed circuit board (PCB), an organic substrate, a flexible plastic substrate, or a paper-based substrate. In the case of a lead frame, the pre-fabricated lead frame can be either printed, stamped or etched and comprise a metal, metal alloy, or a plated lead frame. The pre-fabricated lead frame can comprise bare copper or a pre-plated frame (PPF). The pre-fabricated lead frame can be a leaded lead frame type layout or leadless lead frame type layout.

Step 102 comprises additively depositing an ink comprising particles or a material that forms solid material upon curing or sintering to remove its liquid carrier including a solvent and/or dispersant onto at least one of (i) one or more regions of the die pad and (ii) one or more regions on at least a first of the plurality of contact regions (first contact region). For this additively depositing step, an inkjet printer such as based on piezoelectric, thermal, acoustic, or electrostatic inkjet techniques may be used, or a screen or flexographic printing process may be used.

Surface roughening in one embodiment is achieved by printing discrete drops of nanoparticle ink which are discontinuous, and sintering the drops to become an ink residue for providing solid metal islands with a certain height. The islands can range in size from 0.1 μm to 100 μm depending on the drop size of the ink, and the spacing between drops can be set depending on the density of drops desired. The height of the islands is typically 100 nm to 500 nm for a single drop of ink, and can be built up in height by printing multiple drops on top of one another. Each drop generally comprises an agglomeration of metal nanoparticles being about 20 nm to 50 nm in size (diameter) which melt together in a sintering step with a relatively low temperature (<80° C.) sinter for certain inks.

Metallic nanoinks used for a disclosed inkjet printing process can be selected from any of a number of commercially available or customized nanoinks. One example of a commercial provider of such metallic nanoinks is Cima NanoTech of St. Paul, Minn. In various embodiments, such nanoinks can have nanosize copper, silver, palladium, platinum and/or gold particles mixed into a water-based or other liquid-based carrier formulation to be printed onto the surface to create either a rough topology on the surface, or a different metal chemistry at the surface. This can be printed and cured either before the lead frame plating process, or after the lead frame plating process. If the plating step succeeds the printing of the rough film, the final plated surface will typically maintain the roughness of the printed film. The overall nanoink composition may range from 20 to 100% metallic particle loading by weight, although other composition percentages can also be used. Metal particles in a useful nanoink can range in size from a diameter of about 5 nm to 100 nm, although smaller or larger particle sizes can also be used. Other types of metals may also be used, although the metals listed above generally work well.

The inkjet printer can be selected from any of a number of commercially available or customized inkjet printers. Alternatively, a customized inkjet printer can be designed to work for the specific nanoink. One example of such a customized inkjet printer can be one specifically designed for manufacture by Dimatix, Inc. of Santa Clara, Calif. In further embodiments, a series of inkjet printers can be used, such as where several different distinct nanoinks are to be printed. Such different nanoinks may comprise different metals, may be printed in interactive patterns or layouts, and/or may be printed atop one other, such as after a cure process for each one.

The metal ink can be patterned into films or into a variety of patterns. Example patterned include pillars, grooves, Velcro-style patterns, and a variety of other patterns.

Step 103 comprises sintering or curing the ink to remove the liquid carrier such that a substantially solid ink residue remains. The resulting ink residue films or islands have a microstructure which significantly differs and is morphologically distinct from films formed from conventional metal deposition techniques (e.g., low pressure chemical vapor deposition (LPCVD) or sputtering). For example, disclosed ink residue has high relative porosity and associated specific surface area, typically having at least a portion that has a porosity between 10% and 80%, typically being 20 to 60% porosity. The porosity may not be uniform along the thickness of the ink residue, with the highest porosity generally being towards the top of the residue.

In the case of metal nanoparticles, the sintering can take place at a temperature typically between 60° C. and 200° C. to form a sheet of metal residue or residue in the form of a plurality of metal islands. By controlling the sintering temperature, the grain size within the islands can be controlled (larger grain size from use of a higher temperature). Optionally, an electroplating step can add one or more precious metal layers or precious metal alloy layers such as a stack of NiPdAu in one particular example over printed metallic nanoparticle islands.

Step 104 comprises adding a die attach material (e.g., an epoxy) onto the die pad. Step 105 comprises attaching an integrated circuit (IC) device onto the die pad. Step 106 comprises coupling the bond pads on the IC device to the plurality of contact regions. Wire bonding can be used to form wire bond base packages, or other bonding for other package types such as flip chip bonding for flip chip packages. It is also possible to provide disclosed substrate surface roughening (steps 102, 103) after step 106, such as after wire bonding. Step 107 comprises the optional step of molding to form a mold material.

Because of the additive nature of disclosed printing, either the entire surface of the substrate can be roughened using this method, or only selected areas. The roughness can also be varied across the surface of the substrate by changing the spacing of the islands, and the thickness of the islands allowing for area selective roughening.

Figure 2A:
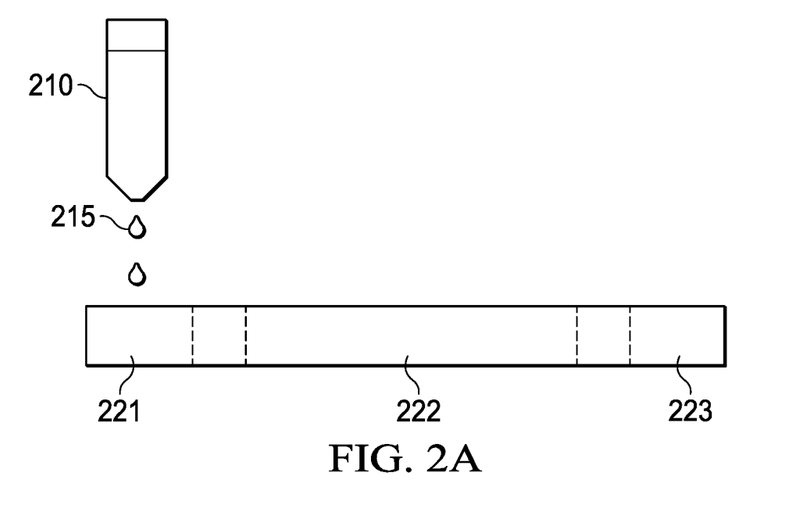
FIGS. 2A-C show cross sectional depictions of steps in an example method of selective surface roughening of substrate surfaces using metallic inks, according to an example embodiment.
Figure 2B:
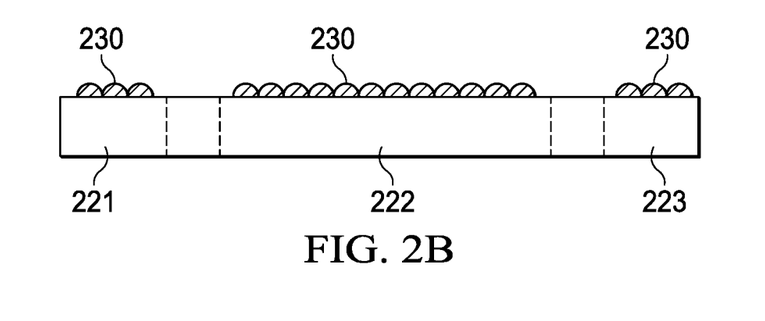
Figure 2C:
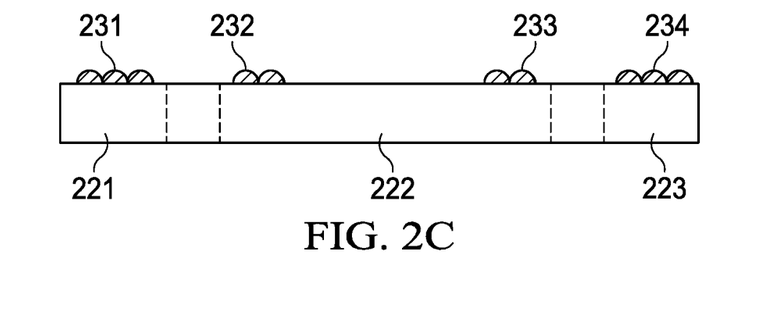

FIGS. 2A-C show cross sectional depictions of steps in an example method of selective surface roughening of substrate surfaces using metallic inks, according to an example embodiment. FIG. 2A shows an ink jet apparatus 210 beginning to dispense metal ink droplets 215 on a contact pad 221 of a substrate. FIG. 2B shows an unpatterned sintered adhesion layer 230 following the additive deposition of the metal ink onto the contact pads 221, 223 and on the die pad 222 and sintering. Flash heating of the metal ink shown can be performed as the sintering step which causes the solvent and/or dispersant to erupt (evaporate) from the metal ink as the metal is fusing together causing the sintered adhesion layer 230 to be a porous, rough metal film comprising ink residue.

Alternatively, sintered adhesion material islands can be formed in the case of a printed ink pattern described relative to the die pad 222 as shown in FIG. 2C. FIG. 2C shows a resulting patterned additive adhesion layer comprising a plurality of individual metal islands 232 and 233 on the die pad 222 after sintering the metal ink following the additive deposition of the metal ink as being unpatterned on the contact pads 221, 223 and patterned on the die pad 222. The metal islands 232 and 233 can be printed 100 nm to 100 μm in diameter, and 100 nm to 100 μm in height. 231 and 234 represent sintered adhesion layers.

Figure 3A:
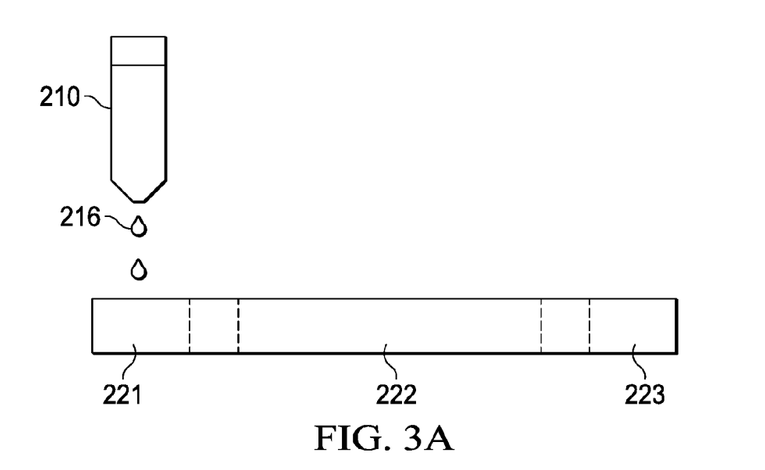
FIGS. 3A-3D show cross sectional depictions of steps in an example method of selective surface roughening of substrate surfaces using metal pillars where the ink particles comprise a dielectric material which forms a pattern of plating stop islands, a metal layer is plated between the plating stop islands, and the plating stop islands are removed to form the plurality of metal pillars, according to an example embodiment.
Figure 3B:
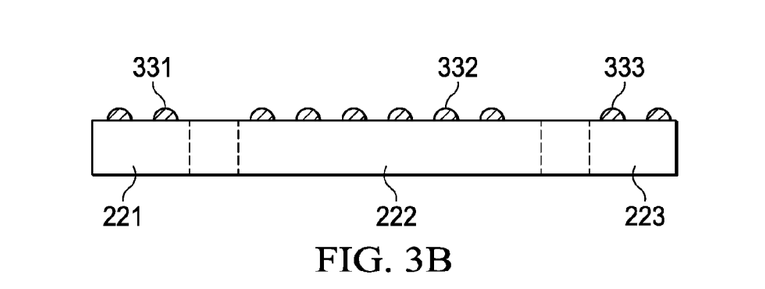

FIGS. 3A-3D show cross sectional depictions of steps in an example method of selective surface roughening of substrate surfaces using metal pillars where the ink particles comprise a dielectric material which forms a pattern of plating stop islands, a metal layer is plated between the plating stop islands, and the plating stop islands are then removed to form the plurality of metal pillars, according to an example embodiment. As in other disclosed embodiments, an additive deposition apparatus such as inkjet, screen, or a flexographic printer is used to deposit a patterned film of plating stop islands over the surface of the substrate as shown. FIG. 3A shows an ink jet apparatus 210 beginning to dispense dielectric ink droplets 216 on a contact pad 221 of a substrate. FIG. 3B shows a resulting patterned additive adhesion layer comprising a plurality of dielectric islands with 331, 332 and 333 identified which each function as plating stop islands after sintering following the additive deposition on the contact pads 221, 223 and on the die pad 222.

Figure 3C:
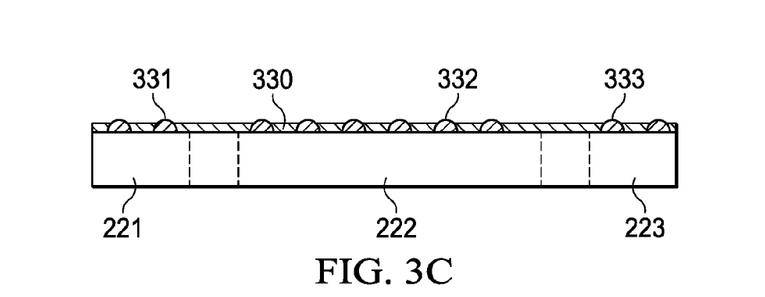
Figure 3D:
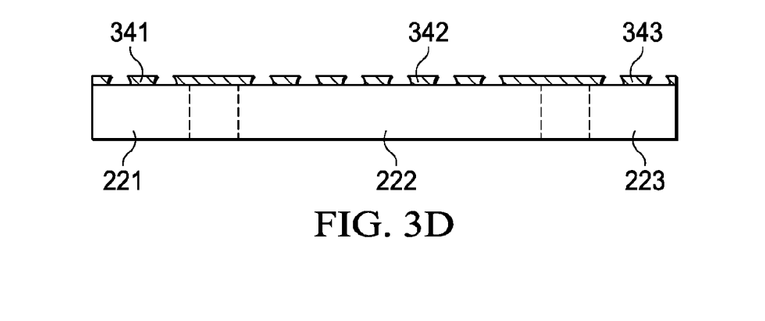

FIG. 3C shows the resulting structure after the plating stop islands are used as a plating (electroless plating or electroplating) mask to plate up a metal layer 330. FIG. 3D shows the resulting structure after removing the protruding plating stop islands to form the metal pillars with metal pillars 341, 342 and 343 shown. The metal pillars add significant surface roughness to the lead frame.

Another embodiment uses a selective printed surface energy barrier to address the wetting problem for the deposition of solder, resin, or die attach material on a substrate. A metallic lead frame surface will typically have a surface energy of 800 mN/m or greater. This is much higher than the surface tension of most fluids (30 to 80 mN/m) which can cause the uncontrolled pulling and spreading of deposited liquids. Low surface energy materials such as polymers, for example Polytetrafluoroethylene (PTFE), SU-8, or silicone, can have surface energies of <20 mN/m. If the surface energy of the material is less than or equal to that of the surface tension of the fluid, it is recognized the fluid will not wet the low surface energy material. This property can be used to create patterned barriers for controlling the flow of solder, resin, or die attach, on the surface of the substrate. Even if the barrier has little or no height, the surface energy barrier created will generally contain the deposited liquid within the patterned surface energy barrier boundaries.

Figure 4A:
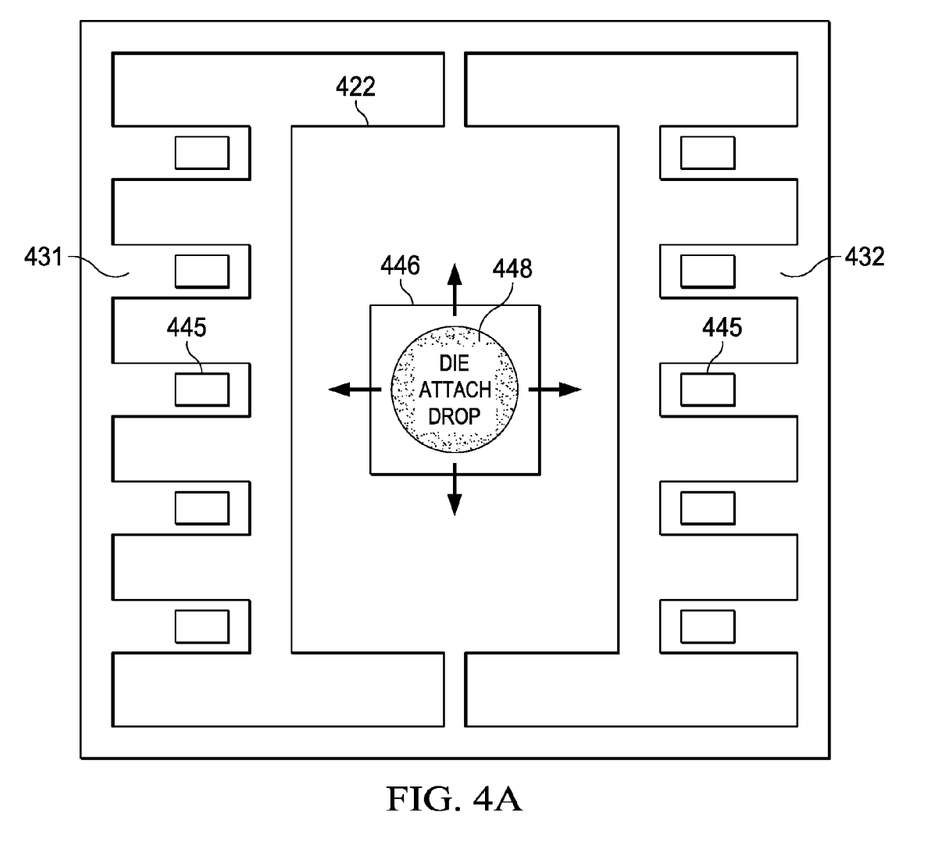
FIGS. 4A-4B show steps cross sectional depictions of an example method of applying patterned surface energy modification of substrate surfaces to contain materials deposited to the lead frame such as die attach, solder flux, which tend to bleed over the substrate, according to an example embodiment.
Figure 4B:
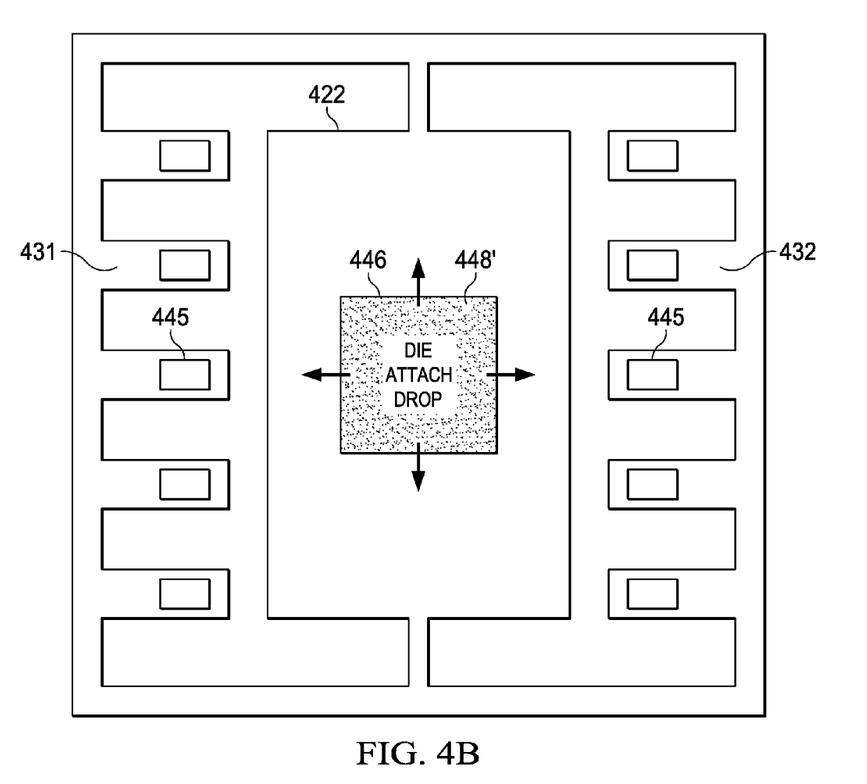

FIGS. 4A-4B show successive cross sectional depictions of an example method of applying patterned surface energy modification of substrate surfaces to contain materials deposited to the lead frame such as die attach and solder flux, which tend to bleed over the substrate such as a lead frame, according to an example embodiment. FIG. 4A shows contact pads with 431 and 432 identified and the die pad 422 having a printed low surface energy barrier material thereon shown as contact pad rings 445 and a die pad ring 446 with a die attach material precursor (e.g., epoxy precursor) drop 448 just after placement on the die pad 422. Although shown as rings, the low surface energy barrier material can if desired fill the entire area encircled. FIG. 4B shows the die attach material drop 448 expansion shown as drop 448' after being stopped at the barrier provided by the die pad ring 446.

Figure 5A:
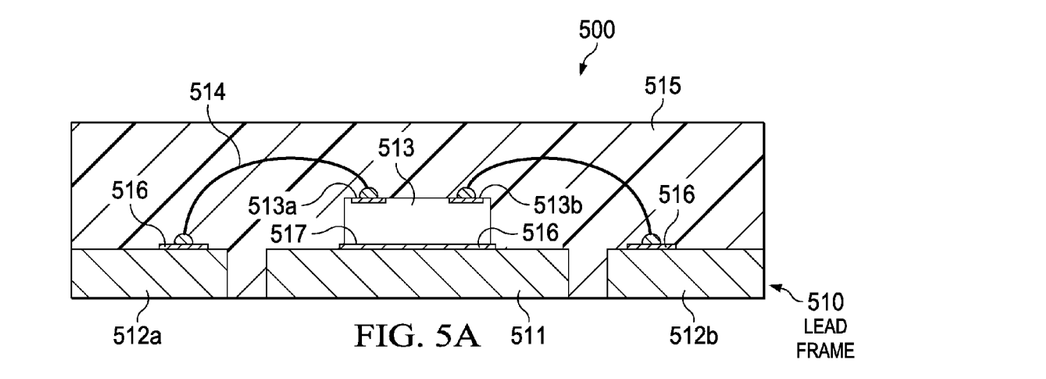
FIG. 5A is a cross sectional depiction of an example packaged semiconductor device having a disclosed additive adhesion layer comprising an ink residue or spaced apart metal pillars on at least one region of its die pad and on at least one region of at least a first its plurality of contact regions, according to an example embodiment.

FIG. 5A is a cross sectional depiction of an example packaged semiconductor device shown as lead frame-based package 500 having a disclosed additive adhesion layer 516 comprising an ink residue layer or spaced apart metal pillars on at least one region of (i) its die pad 511 and (ii) at least one contact region shown as leads 512a and 512b, according to an example embodiment. Package 550 can be a leaded package such as a quad flat package (QFP) or a leadless package such as a quad-flat no-lead (QFN) package.

As shown in FIG. 5A, the bottom surfaces of a die pad 511 and leads 512a, 512b of the lead frame 510 are all exposed and isolated from an encapsulant (e.g., an epoxy) 515. Semiconductor die 513 is mounted on the die pad 511 and its bond pads 513a, 513b are electrically connected to the leads 512a, 512b by bonding wires 514. Thus, heat that is generated by the semiconductor die 513 during operation can be effectively dissipated out of the package 500, and also the package 500 can be directly electrically connected to an external device such as a printed circuit board, PCB (not shown) via the exposed surfaces of the leads 512a, 512b. Die attach material (e.g., an epoxy) 517 is shown between the die 513 and additive adhesion layer 516.

Figure 5B:
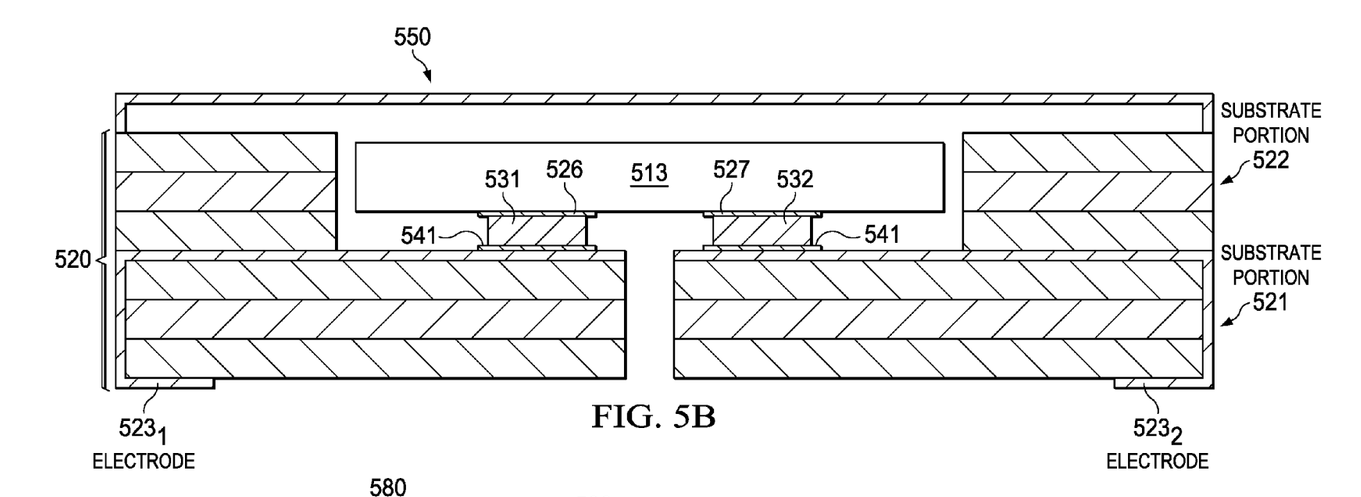
FIG. 5B is a cross sectional view of an example flip chip package that includes build-up layer ceramic package substrate having a disclosed additive adhesion layer comprising an ink solder residue connection, according to another example embodiment.

FIG. 5B is a cross sectional view of an example flip chip package 550 that includes build-up layer ceramic package substrate (ceramic substrate) 520 having a disclosed additive solder ink residue 541 for connection, according to another example embodiment. The die 513 includes bond pads 526 and 527, with copper posts 531 and 532 thereon. Ceramic substrate 520 includes substrate portions 521 and 522 which are each shown including sub-portions. Substrate 520 includes an electrode $523_1$ between substrate portion 521 and 522 extending along the sidewall of the substrate portion 521 to a bottom surface of the substrate portion 521 that also extends on a top side of substrate portion 521 to contact solder ink residue 541 which contacts copper post 531 over bond pad 526. Substrate 520 also includes an electrode $523_2$ between substrate portion 521 and 522 extending along the sidewall of the substrate portion 521 to a bottom surface of the substrate portion 521 that also extends on a top side of substrate portion 521 to contact a solder ink residue 541 which contacts copper post 532 over bond pad 527.

Figure 5C:
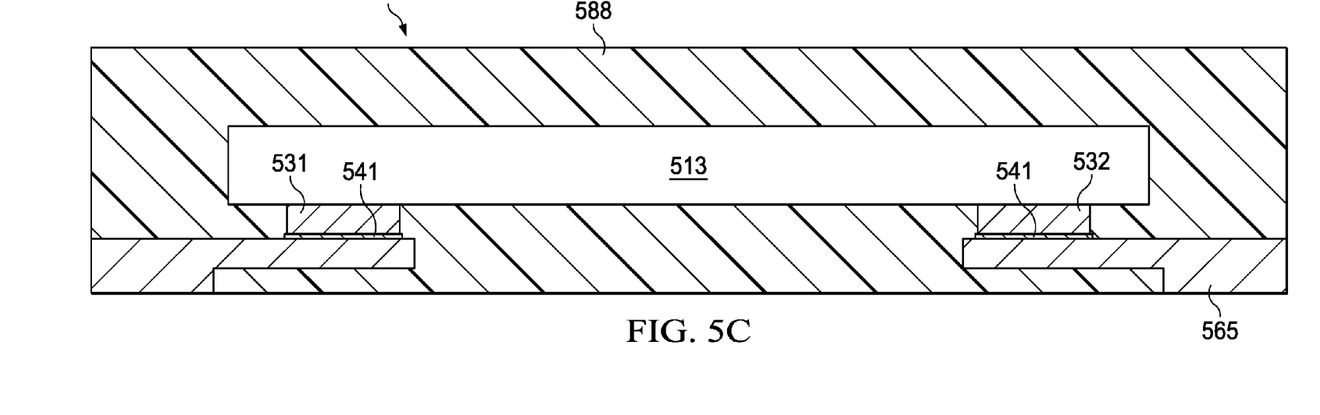
FIG. 5C is a cross sectional view of an example Chip on Lead package that includes a lead frame that has a disclosed additive adhesion layer comprising an ink solder residue connection, according to another example embodiment.

FIG. 5C is a cross sectional view of an example Chip on Lead (COL) package 580 that includes a lead frame that has a disclosed additive adhesion layer comprising a solder ink residue 541 connection, according to another example embodiment. COL package 580 includes lead frame 565 and mold compound 588. The lead frame 565 can comprise copper. As discussed above, disclosed additive deposition methods allow for selective roughness patterning of the lead frame with varying roughness across the surface which is believed to be a new feature of the present invention. The same process that deposits the roughening structures can be used to add low surface energy barriers for the following die attach and solder deposition. Advantages of disclosed embodiments include a lower cost alternative to known surface roughening of the lead frame which is a relatively expensive process when using current methods. By utilizing the disclosed additive deposition method, not only can the cost and material use be reduced, but the lead frame can also have a patterned and area selective roughness.

Disclosed embodiments can be integrated into a variety of assembly flows to form a variety of different packaged semiconductor IC devices and related products. The assembly can comprise a single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of surface modification, comprising:
    providing at least one package substrate comprising a plurality of contact regions;
    depositing an ink comprising a material that is a solid or a precursor for a solid that forms a solid upon a curing step or a sintering step onto at least one of the plurality of contact regions;
    sintering or curing said ink to form an ink residue; and
    electrically connecting a semiconductor device to the ink residue after the step of sintering.

2. The method of claim 1, wherein said depositing comprises inkjet printing using piezoelectric, thermal, acoustic, or electrostatic inkjet printing, screen printing, or flexographic printing.

3. The method of claim 1, wherein said plurality of contact regions comprises a die pad and a plurality of contact pads of a lead frame.

4. The method of claim 1, wherein said step of electrically connecting comprises connecting a bond pad of the semiconductor device to a respective contact region.

5. The method of claim 1, wherein said step of electrically connecting comprises connecting the semiconductor device to a die pad.

6. The method of claim 5, comprising depositing low surface energy material having a surface energy of less than 20 mN/m around at least one of said plurality of contact regions.

7. The method of claim 1, wherein said material has a porosity of greater than 10% and comprises nanoparticles of a metal material.

8. The method of claim 7, wherein said metal material is different than said plurality of contact regions.

9. The method of claim 1, further comprising electroplating over said ink residue with a precious metal layer or a precious metal alloy layer.

10. The method of claim 1, further comprising forming metal terminals on bond pads of the semiconductor device and connecting the metal terminals to the ink residue at respective ones of the plurality of contact regions.

11. A packaged semiconductor device, comprising:
    a package substrate comprising a plurality of contact regions;
    an integrated circuit (IC) having a plurality of bond pads;
    a plurality of leads coupled between respective ones of said plurality of bond pads and respective ones of said plurality of contact regions; and
    an ink residue of spaced apart metal islands on one of the contact regions providing a connection to said IC.

12. The packaged semiconductor device of claim 11, wherein said plurality of leads comprise bond wires.

13. The packaged semiconductor device of claim 11, wherein said bond pads are coupled to said contact regions by metal terminals in a flip chip arrangement so that said packaged semiconductor device comprises a flip chip package.

14. The packaged semiconductor device of claim 11, wherein said ink residue is arranged in a pattern of islands to form a rough surface topology on at least one of said contact regions.

15. The packaged semiconductor device of claim 11, wherein said plurality of leads comprise one of a ball grid array and a pin grid array.

16. The packaged semiconductor device of claim 11, further comprising a precious metal layer or a precious metal alloy layer over said spaced apart metal islands.

17. A method of surface modification, comprising:

providing at least one package substrate comprising a plurality of contact regions;

depositing an ink onto one of the plurality of contact regions, the ink comprising a material that is a solid or a precursor for a solid that forms a solid upon a curing step or a sintering step;

sintering or curing the ink to form a dielectric ink residue pattern;

forming a metal layer within the dielectric ink residue pattern; and removing the dielectric ink residue pattern, thereby forming a plurality of spaced apart metal islands from the metal layer.

18. The method of claim 17, wherein said depositing an ink comprises inkjet printing using piezoelectric, thermal, acoustic, or electrostatic inkjet printing, screen printing, or flexographic printing.

19. The method of claim 17, comprising electrically connecting a semiconductor device to the metal islands.

20. The method of claim 17, wherein said step of forming comprises one of electroless plating and electroplating.

\* \* \* \* \*